(12) United States Patent
Lowenthal et al.

(10) Patent No.: US 6,612,703 B2
(45) Date of Patent: Sep. 2, 2003

(54) SPECTRALLY BEAM COMBINED DISPLAY SYSTEM

(75) Inventors: Dennis D. Lowenthal, Edmonds, WA (US); Scott R. Karlsen, Lynnwood, WA (US)

(73) Assignee: Aculight Corporation, Bothell, WA (US)

( * ) Notice: Subject to any disclaimer, the term of this patent is extended or adjusted under 35 U.S.C. 154(b) by 0 days.

(21) Appl. No.: 10/142,391

(22) Filed: May 8, 2002

(65) Prior Publication Data

US 2003/0048422 A1 Mar. 13, 2003

Related U.S. Application Data

(60) Provisional application No. 60/290,135, filed on May 9, 2001.

(51) Int. Cl.[7] ............................................. G03B 21/14
(52) U.S. Cl. .................... 353/31; 353/121; 348/757
(58) Field of Search .............................. 353/31, 34, 37, 353/121, 122; 348/750, 757; 359/204

(56) References Cited

U.S. PATENT DOCUMENTS

| | | | |
|---|---|---|---|
| 4,833,528 A | 5/1989 | Kobayashi | 358/53 |
| 4,978,202 A | 12/1990 | Yang | 350/331 |
| 5,317,348 A | 5/1994 | Knize | 353/31 |
| 5,485,225 A | 1/1996 | Deter et al. | 348/804 |
| 6,304,237 B1 | 10/2001 | Karakawa | 345/84 |

OTHER PUBLICATIONS

D.M. Bloom, "The Grating Light Valve: revolutionizing display technology", www.siliconlight.com/in_focus/communications/OEG2002031550047 (May 7, 2002).

"New Scanned Linear Grating Light Valve Architecture Powers High–Performance Projection Display System", May 19, 1998 article from Internet web site: www.siliconlight.com/htmlpgs/masterframeset/pressreleasepgs/pressrelease4.html.

C. Gudeman, et al., "Diffractive optical MEMs use grating light valve technique", EE Times article dated Mar. 18, 2002 from Internet web site: www.eetimes.com/in_focus/communications/OEG20020315S0047.

M.H. Wu, "Projection Displays", SPIE—The International Society for Optical Engineering, vol. 2407, Feb. 8–10, 1995, San Jose, CA.

Primary Examiner—William Dowling
(74) Attorney, Agent, or Firm—Bingham McCutchen, LLP; David G. Beck (57) ABSTRACT

A method and apparatus for generating a display is provided. In the disclosed system, each color required by the display is generated by incoherently combining the beams of tens or hundreds of individual lasers. In order to achieve a full color display, three independent IBC systems are used to generate the required three colors (e.g., red, green and blue). The output from each IBC system is modulated and the three beams are combined to form a single, modulated output beam that is directed to a display scanner.

27 Claims, 5 Drawing Sheets

SPECTRALLY BEAM COMBINED DISPLAY SYSTEM

CROSS-REFERENCES TO RELATED APPLICATIONS

This application claims the benefit of provisional patent application Ser. No. 60/290,135 filed May 9, 2001, the disclosure of which is incorporated herein by reference for all purposes.

FIELD OF THE INVENTION

The present invention relates generally to incoherent beam combining and, more particularly, to a method and apparatus for generating a color display.

BACKGROUND OF THE INVENTION

There is an increasing demand for large-screen information displays, both as data displays and entertainment sources. While rapidly developing plasma displays can fill some niches, front and rear projection systems are still the primary means used for those applications requiring a large screen. Projection-based display systems can be realized in several different ways and can utilize CRTs, liquid-crystal image plates or multipixel arrays.

One method of achieving a very bright, high resolution display is to scan a modulated laser beam across the display screen. The technology for scanners and modulators has developed rapidly in the last several years with micro-optical-mechanical systems (MOEMS) and micro-electro-mechanical systems (MEMS) demonstrating very high performance. The development of suitable laser sources, however, has lagged behind these developments in scanner/modulator technology, remaining both overly complicated and expensive. At least in part, the difficulties of utilizing lasers in display devices has been due to the inadequate power, beam brightness, color and durability of typical wavelength-converted solid-state lasers.

To date, diode lasers have been the simplest and lowest cost source for laser-based display systems. Unfortunately, green and blue diode lasers are not widely available nor do they produce sufficient power. For example, diodes emitting in the red wavelength band are available but produce only a few tens of milliwatts. Even worse, the green and blue diode sources under development have only been demonstrated with power levels of a few milliwatts. On the other hand, display applications typically require between 500 milliwatts and 5 watts of output power at all three primary colors.

Accordingly, what is needed in the art is a display system capable of high brightness and resolution using high power, inexpensive, durable laser sources capable of operating at the desired red, green and blue wavelengths. The present invention provides such a system.

SUMMARY OF THE INVENTION

The present invention provides a method and apparatus for generating a display. In the disclosed system, each color required by the display is generated by incoherently combining the beams of tens or hundreds of individual lasers, thus providing sufficiently high output for large displays. Additionally, as the lifetime of a diode laser is an inverse function of its output power, utilizing a large number of lasers for each color source increases the operating lifetime of the system since the individual lasers operate at relatively low powers.

Each incoherently beam combined (IBC) system used in the present invention is comprised of a plurality of gain elements/emitters. The individual IBC cavities are formed by the combination of a high reflectance (HR) coating applied to the back facets of the gain elements/emitters and an external output coupler. Within each IBC cavity is a wavelength dispersive element, such as a diffraction grating, as well as a collimating optic. The front facets of the gain elements/emitters are coated with an anti-reflection (AR) coating, thus insuring that the external cavity sets the lasing wavelength of the individual gain elements/emitters. Preferably within each IBC cavity is at least one optical element that reduces the divergence of the individual gain elements/emitters in the fast axis while having minimal impact on the divergence in the slow axis.

In one embodiment of the invention, three independent IBC systems are used to generate the three colors (e.g., red, green and blue) necessary for a full color display. The output from each IBC system is modulated and the three beams are combined, for example using dichroic beam splitters, to form a single, modulated output beam. The single output beam is then directed to a scanner that generates the display. In one configuration the scanner is an x-y scanner, thus generating the display by scanning a single output beam across the display. In another configuration, the scanner is a one dimensional scanner, this type of scanner being used when the modulated IBC system creates an entire row or column of the desired display.

In another embodiment of the invention, the three IBC systems required for a full color display utilize a common output coupler. This system can be used to reduce the overall system size and complexity, thus further reducing cost. Although a single collimating optic can be used, preferably each IBC system uses a dedicated collimating optic, thus achieving diffraction limited output with simple spherical optics.

In another embodiment of the invention, each IBC system utilizes a beam combining plate to incoherently combine the outputs of a plurality of emitters (e.g., single, transverse mode edge emitters). The emission of each individual emitter passes through a collection/collimating optic, a prism and a wavelength separating element prior to entering the beam combining plate. In at least one embodiment, the wavelength separating elements (e.g., dielectric coating, holographic grating, etc.) are deposited directly onto an exterior surface of the beam combining plate.

A further understanding of the nature and advantages of the present invention may be realized by reference to the remaining portions of the specification and the drawings.

DESCRIPTION OF THE SPECIFIC EMBODIMENTS

Figure 1:
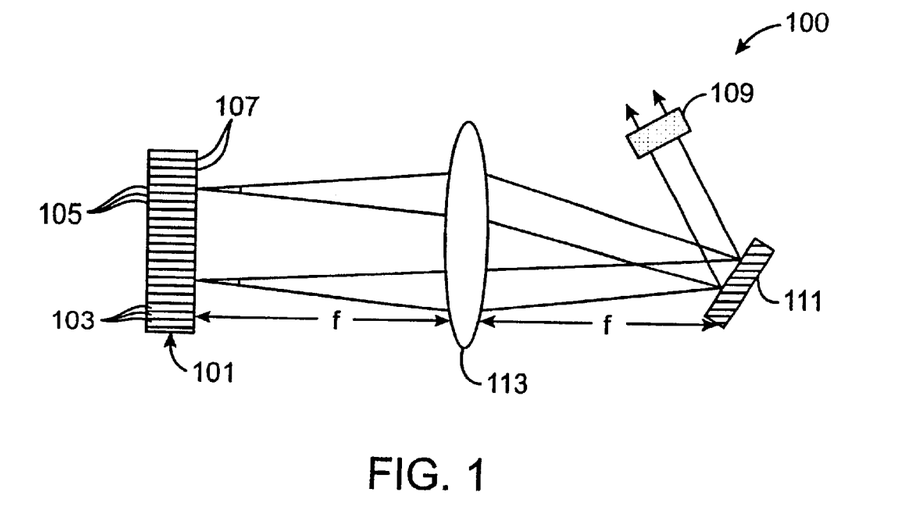
FIG. 1 is a schematic illustration of an IBC laser system according to the prior art.

FIG. 1 schematically illustrates an IBC laser system 100 in accordance with the prior art. System 100 includes an array 101 comprised of a plurality of individual gain elements or emitters 103, all with nominally the same center wavelength. Emitters 103 can be edge emitting diodes, vertical-cavity surface emitting lasers (VCSELs), vertical external cavity surface emitting lasers (VECSELs), diode-pumped solid-state lasers, or other types of lasers. The back facet of each emitter 103 is coated with a high reflectance (HR) coating 105 while the front facet of each emitter 103 is coated with an anti-reflection (AR) coating 107. AR coating 107 insures that the external cavity sets the lasing wavelength by preventing coupled cavity, etalon effects. The optical cavity is formed by the combination of high reflectance coatings 105 and a single external output coupler 109.

Located within the external optical cavity of IBC laser system 100 is a wavelength dispersive element 111. As shown, wavelength dispersive element 111 is a reflective diffraction grating. It is understood that other types of dispersive elements, including both reflective and transmissive elements, can also be used within system 100. Dispersive element 111 forces each of the individual elements of array 101 to operate at a distinct wavelength, thus allowing laser system 100 to output a relatively broad bandwidth.

Also located within the external optical cavity is a lens 113. Lens 113 collects and collimates the light from each emitter 103, directing the light onto dispersive element 111. It is understood that a reflective collimating optic can also be used within system 100. Typically array 101 is located at approximately one focal length distance from lens 113.

Differentiation of the grating equation yields $$\Delta\lambda = d(W_{array}/f)\cos(\theta_G)$$

where $\Delta\lambda$ is the bandwidth of the IBC laser, d is the grating line spacing, $W_{array}$ is the width of the laser gain element array, f is the collimation optic focal length, and $\theta_G$ is the incident angle on the grating. This equation shows that the bandwidth of the IBC laser is directly related to the focal length of the collimating optic, the grating grove spacing, and the array width. Accordingly the bandwidth of such a laser, unlike a more conventional laser, can be optimized for a specific application.

Although the bandwidth of an IBC laser can be optimized for different applications, there are a number of design considerations that must be taken into account when using a gain element array consisting of single transverse mode, edge-emitting semiconductor lasers. First, the resonator must be astigmatic in order to mode match the output of the semiconductor lasers. Mode matching is required to insure operational efficiency. Second, the system must be designed to minimize aberrations, a difficult optical design task due to the large emission angles involved and due to the divergence angle within the plane which is perpendicular to the array (i.e., the fast axis) being different from that within the plane which is parallel to the array (i.e., the slow axis). For this type of emitter, the F-number for the fast axis is typically about F/1 while the F-number for the slow axis is typically about F/3. Additionally, as the resonator optics must operate at F/3 over a field angle defined by the ratio of the bar width to the focal length, this design task becomes increasingly more difficult as the array width is increased.

Assuming a single spherical optic (i.e., simple spherical mirror or thin lens) as shown in the prior art and as illustrated in FIG. 1, and assuming an emitter slow axis F-number of F/3, spherical aberration limits the maximum useable focal length of lens 113 to approximately 25 millimeters. Coma limits the maximum diode bar length to approximately 1.3 millimeters. At an emitter wavelength of 1500 nanometers, diode arrays can be custom manufactured with a linear power density of 5 Watts per centimeter. With a 1.3 millimeter bar width, and assuming 100 percent cavity efficiency, the maximum achievable IBC laser power in this design is 0.8 Watts.

Power scaling for a conventional IBC laser system can be achieved through the use of a large lens group. Due to the divergence of the fast axis, this lens group must perform at F/1 on axis without introducing aberrations. Furthermore, it must be able to operate over the slow axis field angle at F/3 without introducing aberrations. As a result of these requirements, the lens group must use large optics with custom radii and highly aspheric surfaces. Such a design does not lend itself to compact packaging or inexpensive optics.

Figure 2:
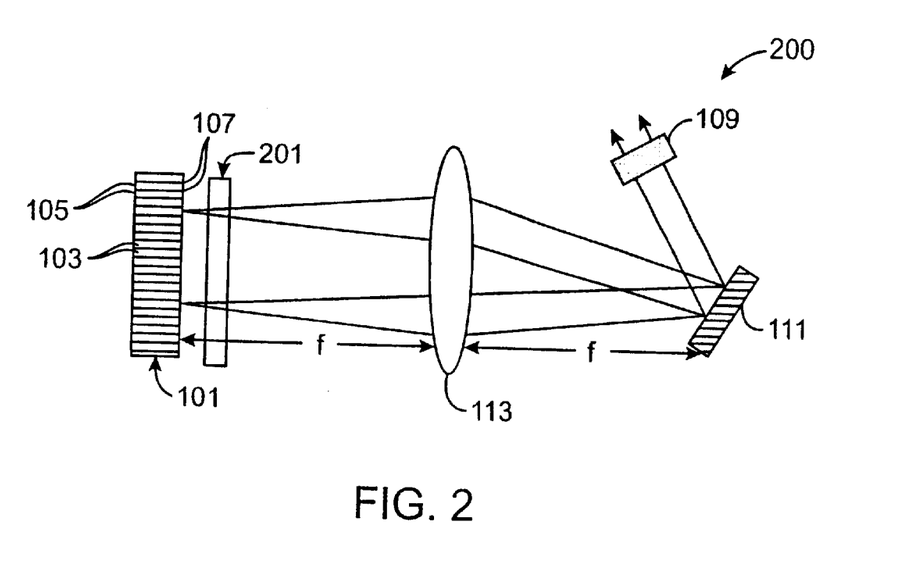
FIG. 2 is a schematic illustration of an IBC laser system such as that illustrated in FIG. 1 with the inclusion of an additional lens element.

FIG. 2 is a schematic illustration of an alternate IBC optical system as disclosed in co-pending U.S. patent application Ser. No. 09/690,233, the disclosure of which is incorporated herein for any and all purposes. IBC optical system 200 is the same as system 100 except for the inclusion of a lens or lens array 201 located between array 101 and lens 113. Preferably lens 201 is immediately adjacent to the AR coated facets of emitters 103. Lens 201 reduces the divergence of emitters 103 thus allowing laser array 101 to be much wider, or alternately, to be comprised of multiple individual arrays, while maintaining a relatively simple resonator optical design. As a consequence, much higher output powers and/or narrower bandwidths can be achieved without utilizing an exceedingly complex optical design.

As disclosed in co-pending U.S. patent application Ser. No. 09/690,233, lens 201 can be comprised of a fast cylindrical lens that reduces the divergence of the light emitted by emitters 103 in the fast axis while having negligible impact on the divergence of the light in the slow axis. Preferably the divergence in the fast axis is reduced to match that of the slow axis, thereby relaxing the on-axis F-number requirements of the cavity optics to those of the slow axis. Alternately, lens 201 can be comprised of a plurality of individual lens elements, each lens element acting upon the emissions of a single emitter 103. By reducing the divergence of each emitter 103, and preferably reducing the divergence of the fast axis such that it substantially matches the divergence of the slow axis, the field angle over which the remainder of the cavity optics must operate is greatly increased. Alternately, lens 201 can be comprised of a fast cylindrical lens used in combination with a plurality of lens elements, the lens elements having a center-to-center spacing matching that of emitters 103. Preferably the fast cylindrical lens reduces the divergence of the light in the fast axis and has negligible effect on the light divergence in the slow axis while the individual lens elements, each of which is a cylindrical lens, reduces the divergence of the light emitted by emitters 103 in the slow axis and has negligible effect on the divergence of the light in the fast axis. By combining the effects of the fast cylindrical lens with the array of lens elements, the astigmatism of the edge emitters is corrected. Alternately, lens 201 can be comprised of a plurality of lens elements configured in an array, each lens element being an aspheric lens having a different focal length in the fast and slow axes.

Figure 3:
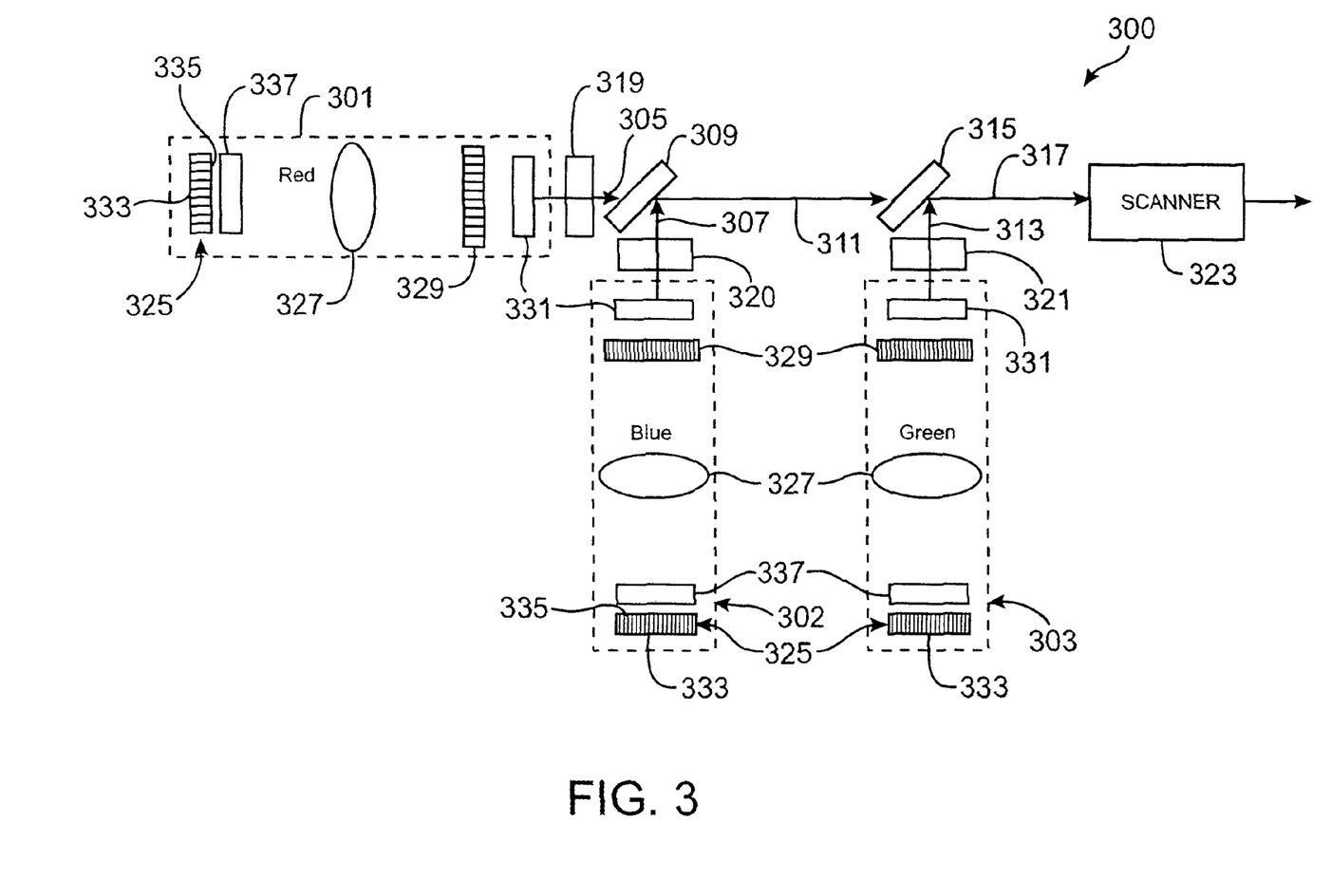
FIG. 3 is an illustration of one embodiment of a multi-color display system in accordance with the invention.

FIG. 3 is an illustration of one embodiment of a multi-color display system 300 in accordance with the invention. System 300 preferably includes three different IBC optical systems, 301–303, thus providing three individual colors and the accompanying capability to support a full color display. As shown, optical system 301 provides a red source (preferably with a center wavelength of approximately 630 nanometers), optical system 302 provides a blue source (preferably with a center wavelength of approximately 470 nanometers), and optical system 303 provides a green source (preferably with a center wavelength of approximately 530 nanometers). Output beam 305 of source 301 is combined with output beam 307 of source 302 using a first dichroic beam splitter 309. Combined beam 311 is combined with output beam 313 of source 303 using a second dichroic beam splitter 315 to form a three-color output beam 317.

In order to use output beam 317 in a display system, each individual color must be modulated. Accordingly, modulators 319–321 are used with optical systems 301–303, respectively. Three-color output beam 317, comprised of the three modulated output beams, is directed to a scanner 323 (e.g., an x-y scanner), scanner 323 directing the modulated three-color beam at the display means (e.g., screen). Scanning systems as well as laser source modulators, both external cavity and intra-cavity modulators, are well known in the art and will therefore not be described in detail herein. In an alternate embodiment, modulation of the intensity of the individual laser sources is accomplished by modulating the current to each diode bar.

In the embodiment shown in FIG. 3, each IBC optical system 301–303 is comprised of an emitter/gain element array 325, a collimating optic 327, a wavelength dispersive element 329 and an output coupler 331. The optical cavity of each IBC optical system is formed by the combination of output coupler 331 and HR coatings 333 applied to the back facets of the individual emitter/gain elements of array 325. AR coatings 335 insure that the external cavity sets the lasing wavelengths. Preferably, and as previously disclosed, one or more optical elements 337 are interposed between each array 325 and each collimating optic 327 in order to reduce the divergence of the individual emitter/gain elements.

It is understood that the individual elements of each IBC optical system 301–303 can be changed without departing from the invention. For example, and as previously discussed in detail, array 325 can be comprised of various different emitter/gain element types, collimating optic 327 can be either reflective or transmissive, and wavelength dispersive element 329 can be either reflective or transmissive. It is also understood that the three IBC optical systems need not utilize identical configurations. For example, IBC optical systems 301 and 302 may be transmissive systems as shown, while IBC optical system 303 may be a reflective or partially reflective system (e.g., using a reflective dispersive element and/or a reflective collimating optic).

Figure 4:
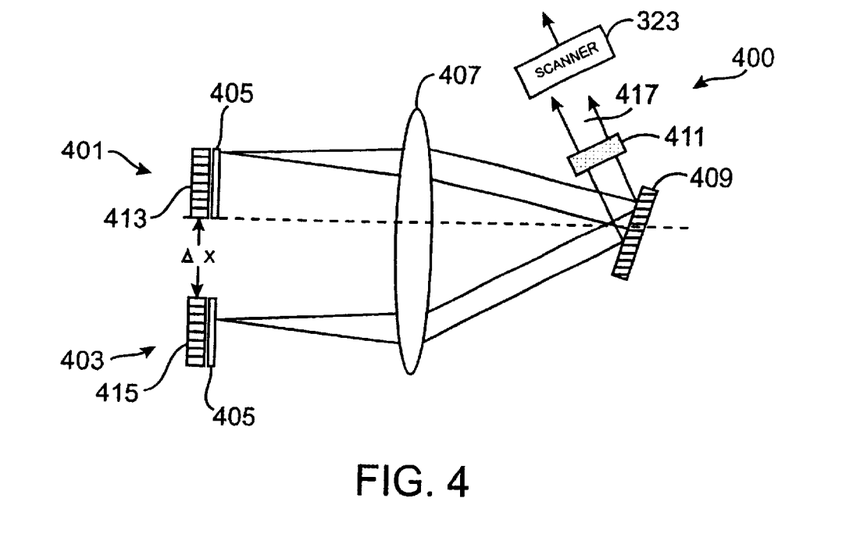
FIG. 4 is an illustration of an alternate embodiment of a spectrally beam combined source for use in a display system.

FIG. 4 is an illustration of an alternate embodiment of a spectrally beam combined source for use in a display system. In this embodiment, several of the optical elements are common to each of the separate, single color IBC systems, thus providing a simplified overall system with size, design complexity and cost benefits. For the sake of drawing simplicity, only a red source 401 and a green source 403 are shown. It will be appreciated that an additional source (e.g., a blue source) can be added to source system 400, thus achieving a three-color system.

As shown in FIG. 4, the emissions from the individual emitter/gain elements of each array 401 and 403 preferably pass through one or more lens elements 405 that reduce the divergence of the individual emitter/gain elements. In this embodiment, a single collimating optic 407 is used to collect and collimate the light from each emitter of both arrays (or from all three arrays for a three-color system), directing the light onto a single dispersive element 409. The optical cavity of each IBC optical system is formed by the combination of a single output coupler 411 and HR coatings 413 and 415 applied to the back facets of the individual emitter/gain elements of arrays 401 and 403, respectively. AR coatings applied to the front facets of the individual emitter/gain elements insure that the external cavity for each of the IBC optical systems sets the lasing wavelengths for the individual emitter/gain elements of each specific IBC system. It will be appreciated that both collimating optic 407 and dispersive element 409 can be either reflective or transmissive.

As in the embodiment illustrated in FIG. 3, the system output beam 417 is directed to a scanner 323, scanner 323 directing the output beam onto a screen or other display means. In this embodiment, preferably modulation of the intensity of each color is achieved by modulating the current to the individual arrays. Alternately, intra-cavity modulators can be used.

A disadvantage of the embodiment illustrated in FIG. 4 is that the optical system, and in particular collimating optic 407, must operate over very large field angles. As a result, aberrations are introduced that limit the applicability of the system with respect to certain display systems (e.g., high definition systems). The requirement for large field angles is driven by the required spatial separation, Δx, between arrays. For example, assuming a typical focal length of 10 to 20 centimeters for collimating optic 407, and given that Δx is on the order of 1 to 2 centimeters for a typical set of parameters, the minimum working field angle is about one tenth of a radian (i.e., approximately 5 degrees). This angle is quite large if diffraction limited output power is desired and, as a result, prohibits the use of simple spherical collimation optics.

Figure 5:
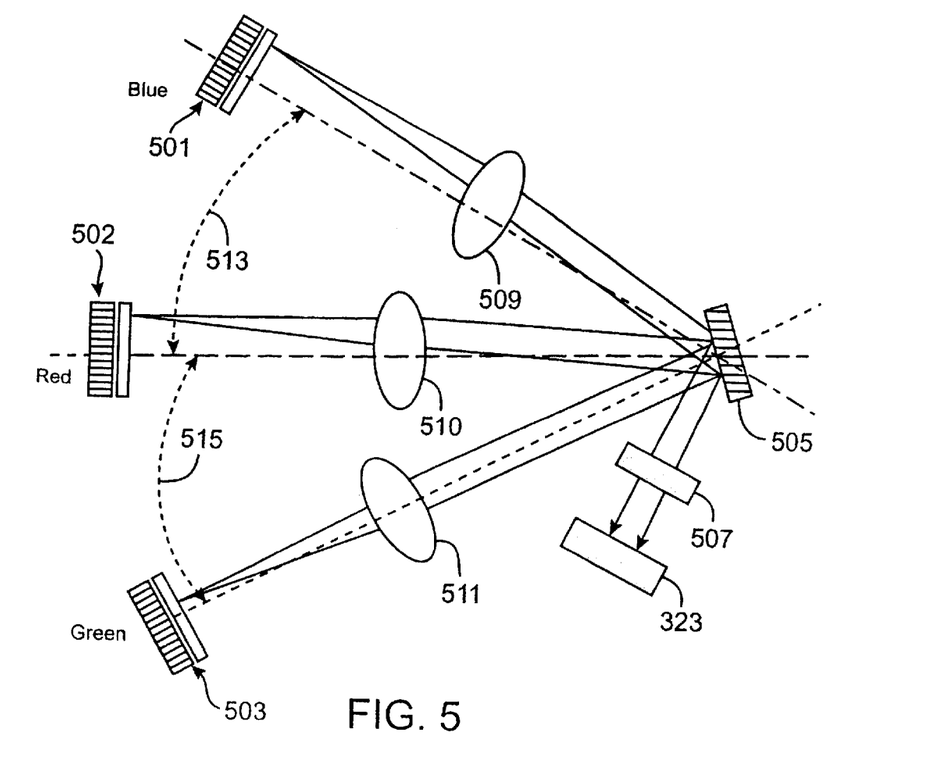
FIG. 5 is an illustration of an alternate embodiment utilizing a single output coupler for all three colors that is compatible with diffraction limited output and simple spherical optics.

FIG. 5 is an illustration of an alternate embodiment utilizing a single output coupler for all three colors that is compatible with diffraction limited output and simple spherical optics. As in the previous embodiment, multiple arrays 501–503 are used with a single wavelength dispersive element 505 and a single output coupler 507. However, in this embodiment each array 501–503 has a dedicated collimating optic 509–511, respectively, thus allowing a large angular shift to be introduced between adjacent arrays (e.g., angular shift 513 between arrays 501 and 502 and angular shift 515 between arrays 502 and 503). Assuming a difference in wavelength between adjacent arrays of approximately 100 nanometers, a typical angular shift is on the order of 10 degrees. The large angular shifts allow the arrays to be widely separated without introducing large off-axis operating angles. In this embodiment the optics for each array operate at the same maximum field angle which is set by the width of each array and the focal length of the associated collimating optic. As an example, assuming a 2 millimeter long array, the field angle is less than 0.5 degrees. This field angle allows diffraction limited beam quality to be maintained while utilizing simple spherical optics.

Figure 6:
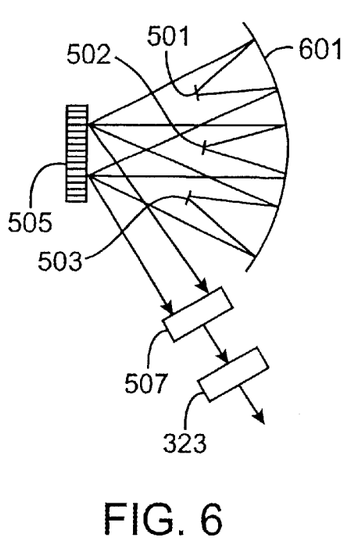
FIG. 6 is an illustration of an embodiment similar to that provided in FIG. 5 except that reflective collimating optics are used.

FIG. 6 is an illustration of an embodiment similar to that provided in FIG. 5 except that transmissive collimating optics 509–511 are replaced with a reflective surface 601. It is understood that although a single reflective, collimating optical surface 601 is shown in FIG. 6, a similar configuration could be used wherein each array utilizes a dedicated reflective, collimating optic. In this embodiment the beams must be shifted to prevent the arrays from obstructing the beams. As a result of this shift, a small amount of off-axis aberration out of the plane of the figure is added.

As in the prior embodiments, the output from output coupler 507 is directed to a scanner 323, scanner 323 directing the output beam onto a screen or other display means. As previously noted, intensity modulation for each color is achieved either by modulating the current of the individual arrays or through the use of intra-cavity modulators.

Figure 7:
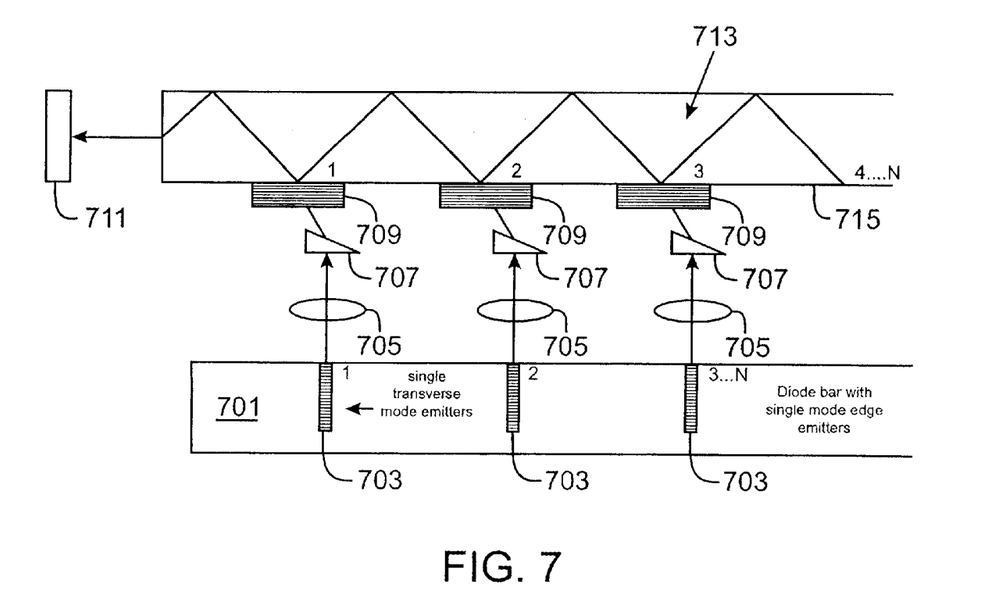
FIG. 7 is an illustration of an alternate IBC laser system for use in a display system such as that shown in FIG. 3.

FIG. 7 is an illustration of an alternate IBC laser system 700. It is understood that IBC laser system 700 is approximately equivalent to one of the IBC systems, 301–303, illustrated in FIG. 3. Accordingly, a three-color display system utilizing IBC laser system 700 would still require two other sources, preferably similar in configuration to system 700, in addition to individual color modulators and a scanner.

System 700 utilizes a diode bar 701 comprised of a plurality of single, transverse mode edge emitters 703. The output from each emitter 703 is collected and collimated with an optical element 705 prior to passing through a prism 707. Although a plurality of individual optical elements 705 and individual prism elements 707 are shown for the sake of simplicity, the inventors expect that an array of optical elements 705 and an array of prism elements 707 would be used, wherein the center-to-center spacing of the individual elements 705 and individual prisms 707 are equivalent to the center-to-center spacing of emitters 703.

The throughput for each prism 707 is directed at an individual wavelength separating element 709. Each wavelength separating element 709 is comprised of either a dielectric coating or a holographic grating and is designed to transmit the wavelength of the corresponding emitter while reflecting the wavelengths that correspond to those emitters that are positioned further from output coupler 711. For example, in the embodiment provided in FIG. 7, the first wavelength separating element 709 (indicated on FIG. 7 with a "1") is designed to transmit $\lambda_1$ while reflecting $\lambda_2$, $\lambda_3$, . . . $\lambda_N$; the second wavelength separating element 709 (indicated on FIG. 7 with a "2") is designed to transmit $\lambda_2$ while reflecting $\lambda_3$, $\lambda_4$ . . . $\lambda_N$; the N−1 wavelength separating element 709 is designed to transmit $\lambda_{N-1}$ while reflecting $\lambda_N$; and the $N^{th}$ wavelength separating element 709 is designed to transmit $\lambda_N$.

In this embodiment of an IBC system, and as illustrated in FIG. 7, preferably the wavelength separating elements 709 are affixed to a beam combining plate 713. In the preferred embodiment, the wavelength separating elements 709 are deposited directly onto a surface 715 of beam combining plate 713. As illustrated, the beams from the individual emitters are combined in beam combining plate 713 rather than in free space as in the previously described IBC systems. An advantage of this embodiment is that each IBC system used to generate each individual color of the display system can be quite compact. Additionally, the various components (e.g., array, lens array, prism array, wavelength separating elements, beam combining plate) can be bonded together into a single unit (or a system comprised of only a few units), thus forming a very robust system.

Figure 8:
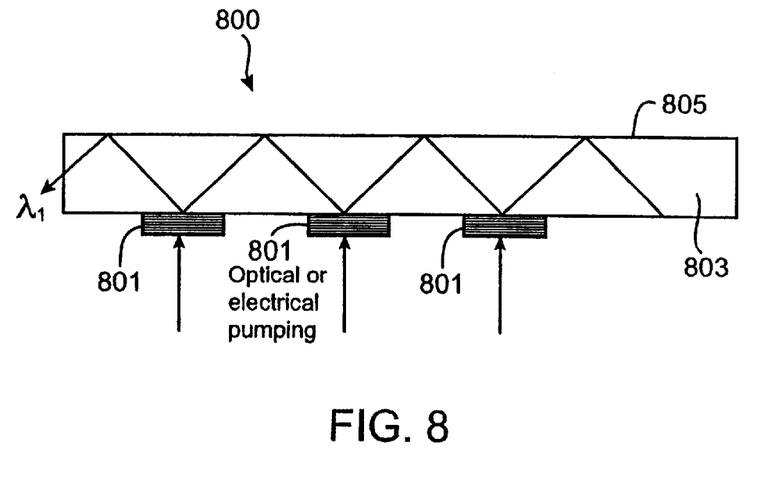
FIG. 8 is an illustration of an alternate source utilizing VCSELs.

FIG. 8 is an illustration of an alternate source 800 utilizing VCSELs. As shown, source 800 is comprised of a plurality of VCSEL lasers 801, the individual VCSELs being either optically or electrically pumped. VCSELs 801 are arranged in a row and coupled to a beam combining element 803 which includes a reflective surface 805 such that their output beams coherently sum at a single wavelength.

Figure 9:
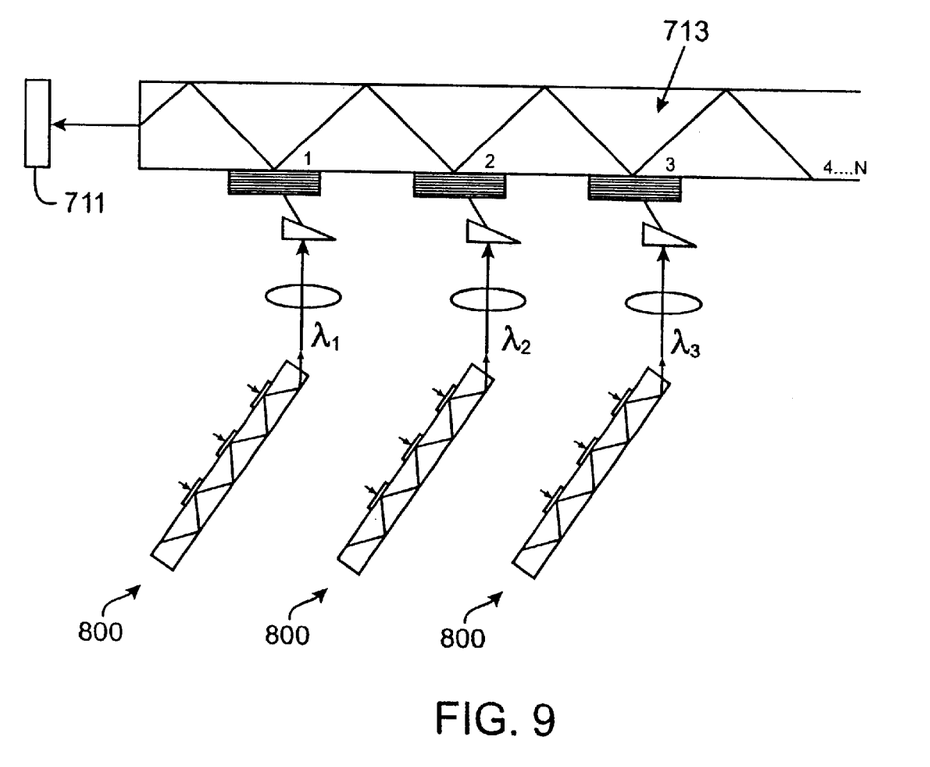
FIG. 9 is an illustration of a plurality of systems such as that shown in FIG. 8 incoherently beam combined using a non-free space IBC system such as that shown in FIG. 7.

A plurality of sources 800 can be incoherently combined using either the free space or the non-free space techniques described above, thus forming individual IBC systems for each color. For example, FIG. 9 illustrates a plurality of systems 800 that are incoherently beam combined using the internal (i.e., non-free space) system 700. Alternately, a plurality of systems 800 can be incoherently beam combined using a system such as that illustrated in FIGS. 1 and 2. Once combined, the output beams from three such systems (e.g., one system producing red, one system producing green, and one system producing blue) are individually modulated, combined, and directed at a suitable scanner as previously described.

In addition to the embodiments described above, it will be appreciated that the disclosed three-color IBC sources are applicable to a wide range of modulator and scanner configurations and those provided above are only meant to be illustrative, not limiting, of the scope of the invention. For example, a variety of microelectromechanical systems (MEMS) are currently under investigation for use in displays. In at least some embodiments of these systems, three-color sources (e.g., red, green and blue LEDs) are used as the light input, the MEMS devices reflecting or refracting the light towards a scanner or directly at the screen. Such MEMS devices include, for example, digital micromirror devices (DMD) and grating light valve (GLV) devices.

In one MEMS based embodiment a three-color IBC system, such as those illustrated in and described with reference to FIGS. 3–6, is used in conjunction with a GLV device. The three-color IBC system illuminates a single pixel as defined by the GLV device. Preferably each color of the three-color IBC system is pulsed at a set frequency (e.g., red-green-blue-red-green-blue, etc). Modulation of the GLV device in timed combination with the pulsed colors yields a modulated pixel that can then be scanned to 'paint' an image on the display. Alternately, each of the three output beams from the three-color IBC system can be slightly offset from one another, each output beam (and color) corresponding to a portion of the single GLV pixel. In this configuration the three individual IBC systems are not pulsed, rather the color of the pixel is determined by the state of the respective red, green, and blue portions of the GLV device. Alternately, three-color IBC systems can be used to form a linear array of individual three-color pixels. This three-color IBC array, used in conjunction with a GLV array, provides one row or column of the desired display. Scanning the row or column with a one-dimensional scanner (e.g., a galvanometric mirror that scans vertically or horizontally) allows the formation of a two-dimensional image. Alternately, three IBC arrays, each dedicated to a specific color (e.g., red, green and blue) can be used in conjunction with three GLV arrays, dedicated to red, green and blue channel modulation, and a one-dimensional scanner to provide a three-color display.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A three-color, light projection system, comprising:
   a first incoherently beam combined (IBC) laser system outputting a first color beam;
   a first means for modulating said first color beam;
   a second IBC laser system outputting a second color beam;
   a second means for modulating said second color beam;
   a third IBC laser system outputting a third color beam;
   a third means for modulating said third color beam; and
   a means for scanning said modulated first, second and third color beams.

2. The three-color, light projection system of claim 1, said first IBC laser system further comprising:
   a first plurality of gain elements, wherein each of said gain elements is further comprised of both a back facet and a front facet;
   a first plurality of high reflectance (HR) coatings on said back facets of said first plurality of gain elements;
   a first plurality of anti-reflection (AR) coatings on said front facets of said first plurality of gain elements;
   a first output coupler;
   a first wavelength dispersive element interposed between said first plurality of gain elements and said first output coupler; and
   a first collimating means interposed between said first plurality of gain elements and said first wavelength dispersive element;
said second IBC laser system further comprising:
   a second plurality of gain elements, wherein each of said gain elements is further comprised of both a back facet and a front facet;
   a second plurality of HR coatings on said back facets of said second plurality of gain elements;
   a second plurality of AR coatings on said front facets of said second plurality of gain elements;
   a second output coupler;
   a second wavelength dispersive element interposed between said second plurality of gain elements and second first output coupler; and
   a second collimating means interposed between said second plurality of gain elements and said second wavelength dispersive element;
said third IBC laser system further comprising:
   a third plurality of gain elements, wherein each of said gain elements is further comprised of both a back facet and a front facet;
   a third plurality of HR coatings on said back facets of said third plurality of gain elements;
   a third plurality of AR coatings on said front facets of said third plurality of gain elements;
   a third output coupler;
   a third wavelength dispersive element interposed between said third plurality of gain elements and said third output coupler; and
   a third collimating means interposed between said third plurality of gain elements and said first wavelength dispersive element.

3. The three-color, light projection system of claim 2, wherein said first, second, and third pluralities of gain elements are selected from the group consisting of edge emitting diodes, vertical-cavity surface emitting lasers (VCSELs), vertical external cavity surface emitting lasers (VECSELs), and diode-pumped solid-state lasers.

4. The three-color, light projection system of claim 2, wherein said first, second, and third wavelength dispersive elements are selected from the group consisting of reflective wavelength dispersive elements and transmissive wavelength dispersive elements.

5. The three-color, light projection system of claim 2, wherein said first, second, and third collimating means are selected from the group consisting of reflective collimating means and transmissive collimating means.

6. The three-color, light projection system of claim 2, said first IBC laser system further comprising a first divergence reducing means interposed between said first plurality of gain elements and said first collimating means, said second IBC laser system further comprising a second divergence reducing means interposed between said second plurality of gain elements and said second collimating means, and said third IBC laser system further comprising a third divergence reducing means interposed between said third plurality of gain elements and said third collimating means.

7. The three-color, light projection system of claim 6, wherein said first, second, and third divergence reducing means are selected from the group consisting of cylindrical lenses, lens arrays, cylindrical lenses used in combination with lens arrays, and aspheric lens arrays.

8. The three-color, light projection system of claim 6, wherein said first divergence reducing means reduces a fast axis divergence corresponding to said first plurality of gain elements to substantially match a slow axis divergence corresponding to said first plurality of gain elements, wherein said second divergence reducing means reduces a fast axis divergence corresponding to said second plurality of gain elements to substantially match a slow axis divergence corresponding to said second plurality of gain elements, and wherein said third divergence reducing means reduces a fast axis divergence corresponding to said third plurality of gain elements to substantially match a slow axis divergence corresponding to said third plurality of gain elements.

9. The three-color, light projection system of claim 2, wherein said first modulating means modulates a current corresponding to said first plurality of gain elements, wherein said second modulating means modulates a current corresponding to said second plurality of gain elements, and wherein said third modulating means modulates a current corresponding to said third plurality of gain elements.

10. The three-color, light projection system of claim 1, wherein at least one of said first, second and third modulating means utilizes a grating light valve (GLV).

11. The three-color, light projection system of claim 1, wherein said first modulation means is a first GLV, wherein said second modulation means is a second GLV, and wherein said third modulation means is a third GLV.

12. The three-color, light projection system of claim 1, said first IBC laser system further comprising:
   a plurality of wavelength sources, wherein each wavelength source of said plurality of wavelength sources comprises:
      a plurality of VCSELs; and
      a beam combining plate, wherein said beam combining plate coherently sums emissions from said plurality of VCSELs;
   an output coupler;
   a wavelength dispersive element interposed between said plurality of wavelength sources and said output coupler; and a collimating means interposed between said plurality of wavelength sources and said wavelength dispersive element.

13. The three-color, light projection system of claim 1, said first IBC laser system further comprising:
   a first plurality of wavelength sources, wherein each wavelength source of said first plurality of wavelength sources comprises:
      a first plurality of VCSELs; and
      a first beam combining plate, wherein said first beam combining plate coherently sums emissions from said first plurality of VCSELS;
   a first output coupler;
   a first wavelength dispersive element interposed between said first plurality of wavelength sources and said first output coupler; and
   a first collimating means interposed between said first plurality of wavelength sources and said first wavelength dispersive element;
said second IBC laser system further comprising:
   a second plurality of wavelength sources, wherein each wavelength source of said second plurality of wavelength sources comprises:
      a second plurality of VCSELs; and
      a second beam combining plate, wherein said second beam combining plate coherently sums emissions from said second plurality of VCSELs;
   a second output coupler;
   a second wavelength dispersive element interposed between said second plurality of wavelength sources and said second output coupler; and
   a second collimating means interposed between said second plurality of wavelength sources and said second wavelength dispersive element;
said third IBC laser system further comprising:
   a third plurality of wavelength sources, wherein each wavelength source of said third plurality of wavelength sources comprises:
      a third plurality of VCSELs; and
      a third beam combining plate, wherein said third beam combining plate coherently sums emissions from said third plurality of VCSELs;
   a third output coupler;
   a third wavelength dispersive element interposed between said third plurality of wavelength sources and said third output coupler; and
   a third collimating means interposed between said third plurality of wavelength sources and said third wavelength dispersive element.

14. The three-color, light projection system of claim 1, said first IBC laser system further comprising:
   a plurality of single transverse mode emitters;
   a plurality of collimating optics with a collimating optic center-to-center spacing equivalent to an emitter center-to-center spacing corresponding to said plurality of emitters, wherein said plurality of collimating optics are adjacent to said plurality of emitters;
   a plurality of prisms with a prism center-to-center spacing equivalent to said emitter center-to-center spacing corresponding to said plurality of emitters, wherein said plurality of prisms are adjacent to said plurality of collimating optics;
   a plurality of wavelength separating elements with a wavelength separating element center-to-center spacing equivalent to said emitter center-to-center spacing corresponding to said plurality of emitters, wherein said plurality of wavelength separating elements are adjacent to said plurality of prisms;
   a beam combining plate, wherein a plurality of emissions from said plurality of emitters pass through said a plurality of collimating optics, through said plurality of prisms, through said plurality of wavelength separating elements and are incoherently combined within said beam combining plate; and
   an output coupler.

15. The three-color, light projection system of claim 1, said first IBC laser system further comprising:
   a first plurality of single transverse mode emitters;
   a first plurality of collimating optics with a collimating optic center-to-center spacing equivalent to an emitter center-to-center spacing corresponding to said first plurality of emitters, wherein said first plurality of collimating optics are adjacent to said first plurality of emitters;
   a first plurality of prisms with a prism center-to-center spacing equivalent to said emitter center-to-center spacing corresponding to said first plurality of emitters, wherein said first plurality of prisms are adjacent to said first plurality of collimating optics;
   a first plurality of wavelength separating elements with a wavelength separating element center-to-center spacing equivalent to said emitter center-to-center spacing corresponding to said first plurality of emitters, wherein said first plurality of wavelength separating elements are adjacent to said first plurality of prisms;
   a first beam combining plate, wherein a first plurality of emissions from said first plurality of emitters pass through said a first plurality of collimating optics, through said first plurality of prisms, through said first plurality of wavelength separating elements and are incoherently combined within said first beam combining plate; and
   a first output coupler;
said second IBC laser system comprising:
   a second plurality of single transverse mode emitters;
   a second plurality of collimating optics with a collimating optic center-to-center spacing equivalent to an emitter center-to-center spacing corresponding to said second plurality of emitters, wherein said second plurality of collimating optics are adjacent to said second plurality of emitters;
   a second plurality of prisms with a prism center-to-center spacing equivalent to said emitter center-to-center spacing corresponding to said second plurality of emitters, wherein said second plurality of prisms are adjacent to said second plurality of collimating optics;
   a second plurality of wavelength separating elements with a wavelength separating element center-to-center spacing equivalent to said emitter center-to-center spacing corresponding to said second plurality of emitters, wherein said second plurality of wavelength separating elements are adjacent to said second plurality of prisms;
   a second beam combining plate, wherein a second plurality of emissions from said second plurality of emitters pass through said a second plurality of collimating optics, through said second plurality of prisms, through said second plurality of wavelength separating elements and are incoherently combined within said second beam combining plate; and a second output coupler;
said third IBC laser system comprising:
   a third plurality of single transverse mode emitters;
   a third plurality of collimating optics with a collimating optic center-to-center spacing equivalent to an emitter center-to-center spacing corresponding to said third plurality of emitters, wherein said third plurality of collimating optics are adjacent to said third plurality of emitters;
   a third plurality of prisms with a prism center-to-center spacing equivalent to said emitter center-to-center spacing corresponding to said third plurality of emitters, wherein said third plurality of prisms are adjacent to said third plurality of collimating optics;
   a third plurality of wavelength separating elements with a wavelength separating element center-to-center spacing equivalent to said emitter center-to-center spacing corresponding to said third plurality of emitters, wherein said third plurality of wavelength separating elements are adjacent to said third plurality of prisms;
   a third beam combining plate, wherein a third plurality of emissions from said third plurality of emitters pass through said third plurality of collimating optics, through said third plurality of prisms, through said third plurality of wavelength separating elements and are incoherently combined within said third beam combining plate; and
   a third output coupler.

16. The three-color, light projection system of claim 1, said first IBC laser system further comprising:
   a plurality of wavelength sources, wherein each wavelength source of said plurality of wavelength sources comprises:
      a plurality of VCSELs emitting a plurality of output beams; and
      a first beam combining plate, wherein said first beam combining plate coherently sums said plurality of output beams from said plurality of VCSELs to form a single wavelength beam;
   a plurality of collimating optics corresponding to said plurality of wavelength sources;
   a plurality of prisms corresponding to said plurality of collimating optics;
   a plurality of wavelength separating elements corresponding to said plurality of prisms;
   a second beam combining plate, wherein each single wavelength beam of said plurality of wavelength sources pass through a corresponding collimating optic of said a plurality of collimating optics, pass through a corresponding prism of said plurality of prisms, pass through a corresponding wavelength separating element of said plurality of wavelength separating elements and are incoherently combined within said second beam combining plate; and
   an output coupler.

17. The three-color, light projection system of claim 1, said first IBC laser system further comprising:
   a first plurality of wavelength sources, wherein each wavelength source of said first plurality of wavelength sources comprises:
      a first plurality of VCSELs; and
      a first beam combining plate, wherein said first beam combining plate coherently sums emissions from said first plurality of VCSELs;
   a first plurality of collimating optics corresponding to said first plurality of wavelength sources;
   a first plurality of prisms corresponding to said first plurality of collimating optics;
   a first plurality of wavelength separating elements corresponding to said first plurality of prisms;
   a second beam combining plate, wherein said second beam combining plate incoherently combines emissions from said first plurality of wavelength sources;
   a first output coupler;
said second IBC laser system further comprising:
   a second plurality of wavelength sources, wherein each wavelength source of said second plurality of wavelength sources comprises:
      a second plurality of VCSELs; and
      a third beam combining plate, wherein said third beam combining plate coherently sums emissions from said second plurality of VCSELs;
   a second plurality of collimating optics corresponding to said second plurality of wavelength sources;
   a second plurality of prisms corresponding to said second plurality of collimating optics;
   a second plurality of wavelength separating elements corresponding to said second plurality of prisms;
   a fourth beam combining plate, wherein said fourth beam combining plate incoherently combines emissions from said second plurality of wavelength sources;
   a second output coupler;
said third IBC laser system further comprising:
   a third plurality of wavelength sources, wherein each wavelength source of said third plurality of wavelength sources comprises:
      a third plurality of VCSELs; and
      a fifth beam combining plate, wherein said fifth beam combining plate coherently sums emissions from said third plurality of VCSELs;
   a third plurality of collimating optics corresponding to said third plurality of wavelength sources;
   a third plurality of prisms corresponding to said third plurality of collimating optics;
   a third plurality of wavelength separating elements corresponding to said third plurality of prisms;
   a sixth beam combining plate, wherein said sixth beam combining plate incoherently combines emissions from said third plurality of wavelength sources; and
   a third output coupler.

18. A three-color, light projection system, comprising:
   a first plurality of gain elements;
   a second plurality of gain elements;
   a third plurality of gain elements, wherein each gain element of said first, second and third pluralities of gain elements further comprises:
      a back facet coated with an HR coating; and
      a front facet coated with an AR coating;
   an output coupler, wherein a first cavity is formed between said HR coated back facets of said first plurality of gain elements and said output coupler, wherein a second cavity is formed between said HR coated back facets of said second plurality of gain elements and said output coupler, and wherein a third cavity is formed between said HR coated back facets of said third plurality of gain elements and said output coupler;
   a wavelength dispersive element interposed between said first plurality of gain elements and said output coupler, wherein said wavelength dispersive element is interposed between said second plurality of gain elements and said output coupler, and wherein said wavelength dispersive element is interposed between said third plurality of gain elements and said output coupler;

at least one collimating optic interposed between said first, second and third pluralities of gain elements and said wavelength dispersive element;

a first means for modulating a first output corresponding to said first cavity;

a second means for modulating a second output corresponding to said second cavity;

a third means for modulating a third output corresponding to said third cavity; and a scanner for scanning said modulated first, second and third outputs.

19. The three-color, light projection system of claim 18, wherein said at least one collimating optic further comprises:

a first collimating optic interposed between said first plurality of gain elements and said wavelength dispersive element;

a second collimating optic interposed between said second plurality of gain elements and said wavelength dispersive element; and a third collimating optic interposed between said third plurality of gain elements and said wavelength dispersive element.

20. The three-color, light projection system of claim 18, wherein said at least one collimating optic is a reflective optic.

21. The three-color, light projection system of claim 19, wherein said first, second, and third collimating optics are reflective optics.

22. The three-color, light projection system of claim 18, further comprising:

a first divergence reducing means interposed between said first plurality of gain elements and said at least one collimating optic;

a second divergence reducing means interposed between said second plurality of gain elements and said at least one collimating optic; and a third divergence reducing means interposed between said third plurality of gain elements and said at least one collimating optic.

23. The three-color, light projection system of claim 22, wherein said first, second, and third divergence reducing means are selected from the group consisting of cylindrical lenses, lens arrays, cylindrical lenses used in combination with lens arrays, and aspheric lens arrays.

24. The three-color, light projection system of claim 22, wherein said first divergence reducing means reduces a fast axis divergence corresponding to said first plurality of gain elements to substantially match a slow axis divergence corresponding to said first plurality of gain elements, wherein said second divergence reducing means reduces a fast axis divergence corresponding to said second plurality of gain elements to substantially match a slow axis divergence corresponding to said second plurality of gain elements, and wherein said third divergence reducing means reduces a fast axis divergence corresponding to said third plurality of gain elements to substantially match a slow axis divergence corresponding to said third plurality of gain elements.

25. The three-color, light projection system of claim 18, wherein said first modulating means modulates a current corresponding to said first plurality of gain elements, wherein said second modulating means modulates a current corresponding to said second plurality of gain elements, and wherein said third modulating means modulates a current corresponding to said third plurality of gain elements.

26. The three-color, light projection system of claim 18, wherein said first, second, and third pluralities of gain elements are selected from the group consisting of edge emitting diodes, VCSELs, VECSELs, and diode-pumped solid-state lasers.

27. A method of generating a display, comprising the steps of:

incoherently beam combining a first plurality of emissions from a first plurality of laser sources to form a first color output beam;

modulating said first color output beam;

incoherently beam combining a second plurality of emissions from a second plurality of laser sources to form a second color output beam;

modulating said second color output beam;

incoherently beam combining a third plurality of emissions from a third plurality of laser sources to form a third color output beam;

modulating said third color output beam;

combining said modulated first, second and third color output beams to form a modulated three-color output beam; and scanning said modulated three-color output beam to generate the display.

* * * * *